(12) United States Patent
Tan et al.

(10) Patent No.: US 9,431,253 B1
(45) Date of Patent: Aug. 30, 2016

(54) FABRICATION FLOW BASED ON METAL GATE PROCESS FOR MAKING LOW COST FLASH MEMORY

(71) Applicant: Texas Instruments Incorporated, Dallas, TX (US)

(72) Inventors: Ning Tan, Allen, TX (US); Weidong Tian, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/819,401

(22) Filed: Aug. 5, 2015

(51) Int. Cl.
| | |
|---|---|
| *H01L 21/336* | (2006.01) |
| *H01L 21/3205* | (2006.01) |
| *H01L 21/266* | (2006.01) |
| *H01L 27/115* | (2006.01) |
| *H01L 21/28* | (2006.01) |
| *H01L 21/8238* | (2006.01) |
| *H01L 21/8234* | (2006.01) |
| *H01L 21/265* | (2006.01) |
| *H01L 27/105* | (2006.01) |

(52) U.S. Cl.
CPC ....... *H01L 21/266* (2013.01); *H01L 21/26586* (2013.01); *H01L 21/28008* (2013.01); *H01L 21/28273* (2013.01); *H01L 21/823456* (2013.01); *H01L 21/823814* (2013.01); *H01L 27/11521* (2013.01); *H01L 27/1052* (2013.01)

(58) Field of Classification Search
CPC .................. H01L 21/28273; H01L 21/28282; H01L 21/266; H01L 21/324; H01L 21/28518; H01L 21/3086; H01L 21/32155; H01L 21/823412; H01L 21/823425; H01L 21/823437; H01L 21/823443
USPC ............................... 438/593, 258, 257, 266
See application file for complete search history.

(56) References Cited

U.S. PATENT DOCUMENTS

| | | | |
|---|---|---|---|
| 6,410,387 B1 * | 6/2002 | Cappelletti | H01L 27/105 257/E21.689 |
| 6,642,111 B1 * | 11/2003 | Hsu | H01L 27/115 257/E21.645 |
| 6,914,820 B1 * | 7/2005 | Wong | G11C 11/5628 257/E21.209 |
| 7,745,295 B2 * | 6/2010 | Hanafi | B82Y 10/00 257/324 |
| 2012/0223381 A1 * | 9/2012 | Lu | H01L 21/28282 257/324 |

* cited by examiner

*Primary Examiner* — Shouxiang Hu
(74) *Attorney, Agent, or Firm* — Jacqueline J. Garner; Frank D. Cimino

(57) ABSTRACT

An integrated circuit contains a flash cell in which the top gate of the sense transistor is a metal sense gate over the floating gate. The source/drain regions of the sense transistor extend under the floating gate so that the source region is separated from the drain region by a sense channel length less than 200 nanometers. The floating gate is at least 400 nanometers wide, so the source/drain regions of the sense transistor extend under the floating gate at least 100 nanometers on each side. The integrated circuit is formed by forming the sense transistor source and drain regions before forming the floating gate.

11 Claims, 11 Drawing Sheets

FABRICATION FLOW BASED ON METAL GATE PROCESS FOR MAKING LOW COST FLASH MEMORY

FIELD OF THE INVENTION

This invention relates to the field of integrated circuits. More particularly, this invention relates to flash memory cells in integrated circuits.

BACKGROUND OF THE INVENTION

An integrated circuit contains a flash memory cell in which a top gate of the sense transistor is a metal plate over the floating gate. This flash cell may be integrated into a complementary metal oxide semiconductor (CMOS) fabrication flow with the addition of one extra photolithography operation. The top gate is formed by a wet etch process which undercuts the metal plate, requiring the floating gate to be oversized. Oversizing the floating gate may lead to reliability problems for the flash cell due to increased hot carrier injection. The oversized floating gate requires large lateral field for efficient hot carrier injection programming. For certain process, the required value is physically impossible to achieve. In order to enable efficient HCI programming at low drain voltage, for example less than 6 volt, the channel length must be reduced.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit contains a flash cell in which the top gate of the sense transistor is a metal sense gate over the floating gate. The source/drain regions of the sense transistor extend under the floating gate so that the source region is separated from the drain region by a sense channel length less than 200 nanometers. The metal sense gate does not extend past the floating gate over the source and drain regions. The floating gate is at least 400 nanometers wide, so the source/drain regions of the sense transistor extend under the floating gate at least 100 nanometers on each side. The integrated circuit is formed by forming the sense transistor source and drain regions before forming the floating gate.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit contains a flash cell in which the top gate of the sense transistor is a metal sense gate over the floating gate. The source/drain regions of the sense transistor extend partway under the floating gate so that the source region is separated from the drain region by a sense channel length less than 200 nanometers. The metal sense gate does not extend past the floating gate over the source and drain regions. The floating gate is at least 400 nanometers wide, so the source/drain regions of the sense transistor extend under the floating gate at least 100 nanometers on each side. The integrated circuit is formed by forming the sense transistor source and drain regions before forming the floating gate.

Figure 1:
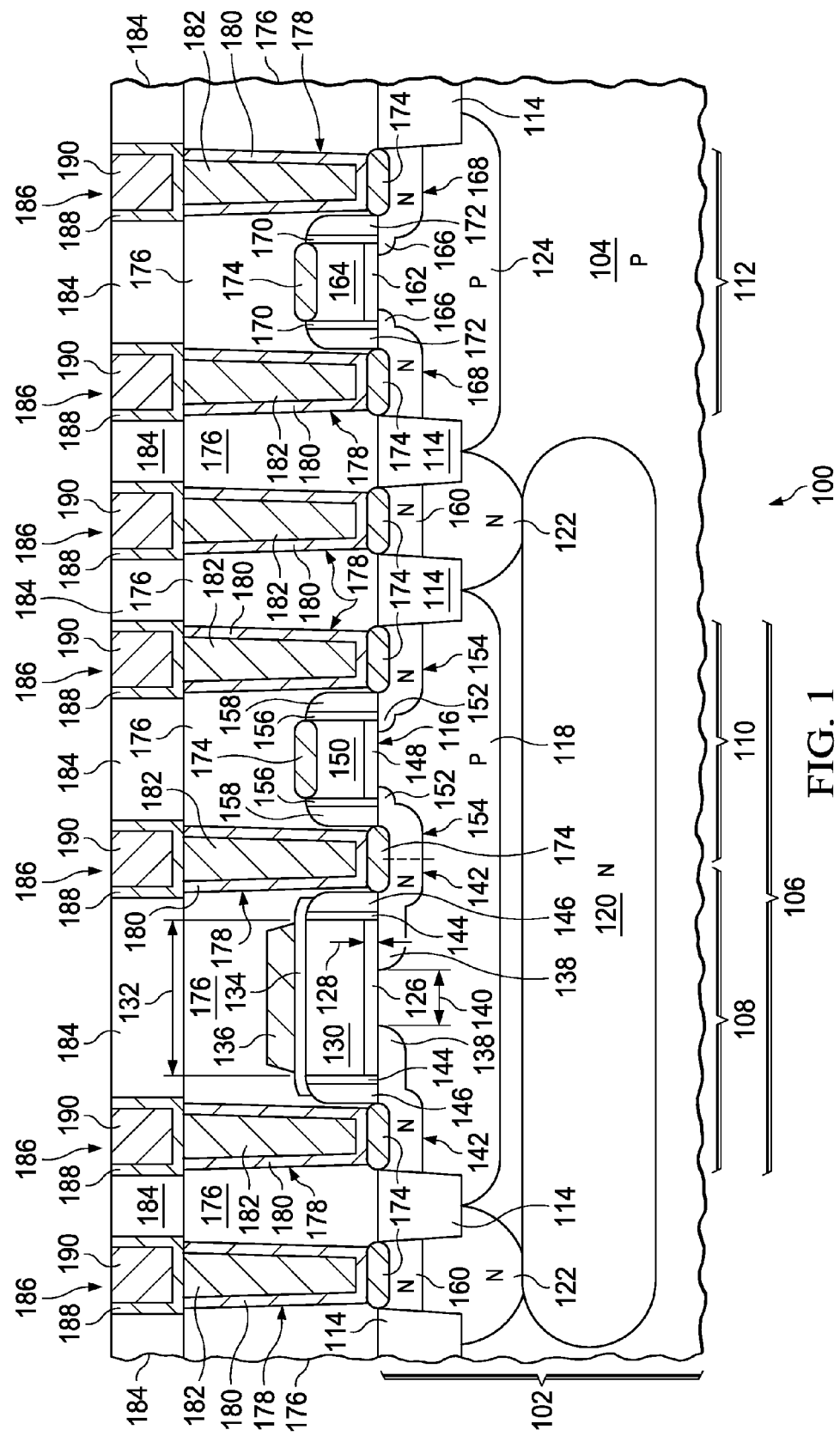
FIG. 1 is a cross section of an example integrated circuit.

FIG. 1 is a cross section of an example integrated circuit. The integrated circuit 100 is formed on a substrate 102 comprising a semiconductor material 104. The substrate 102 may be, for example, single-crystal silicon. The semiconductor material 104 may also be single-crystal silicon. In the instant example, the semiconductor material 104 is p-type. The integrated circuit 100 includes a flash memory 106 which has at least one sense transistor 108 and may have an access transistor 110. In the instant example, the sense transistor 108 and the access transistor 110 are n-channel metal oxide semiconductor (NMOS) transistors. The integrated circuit 100 may also include at least one logic NMOS transistor 112, separate from the flash memory 106. Field oxide 114 is disposed at a top surface 116 of the substrate 102 to laterally isolate components of the integrated circuit 100. The sense transistor 108 and the access transistor 110 are disposed in an isolated p-type well 118 in the substrate 102. The isolated p-type well 118 is electrically isolated by a combination of a deep n-type well 120 disposed in the substrate 102 under the isolated p-type well 118 and an n-type well 122 laterally surrounding the isolated p-type well 118. The logic NMOS transistor 112 is disposed in a p-type well 124 which contacts the p-type semiconductor material 104 of the substrate 102.

The sense transistor 108 includes a gate dielectric layer 126 with a thickness 128 on the top surface 116 of the substrate 102 in the isolated p-type well 118, and a floating gate 130 with a width 132 on the gate dielectric layer 126. The thickness 128 of the gate dielectric layer 126 is less than 3.0 nanometers, and may be 1.5 nanometers to 2.5 nanometers. The floating gate 130 may be, for example, polycrystalline silicon, referred to herein as polysilicon. The width 132 is at least 400 nanometers. A top gate dielectric layer 134 is disposed over the floating gate 130, extending across the width 132 of the floating gate 130, and a metal sense gate 136 is disposed over the top gate dielectric layer 134. The metal sense gate 136 does not extend past the floating gate 130 on source and drain sides of the sense transistor 108. The metal sense gate 136 may be, for example, 40 nanometers to 80 nanometers thick. N-type sense source/drain regions 138 are disposed in the isolated p-type well 118, extending partway under the floating gate 130. The sense source/drain regions 138 are separated by a sense channel length 140 under the floating gate 130; the sense channel length 140 is less than 200 nanometers, so that the sense source/drain regions 138 extend under the floating gate 130 by at least 100 nanometers on each source and drain side of the sense transistor 108. By way of example, source/drain regions of comparable logic transistors may extend under corresponding logic gates less than 25 nanometers on each source and drain side. The sense source/drain regions 138 may include deep source/drain portions 142 disposed outward of the floating gate 130. Offset spacers 144 are disposed on sidewalls of the floating gate 130 and source/drain sidewall spacers 146 are disposed on the offset spacers 144.

The access transistor 110 includes a gate dielectric layer 148 disposed on the top surface 116 of the substrate 102 in the isolated p-type well 118, and a gate 150 on the gate dielectric layer 148. The gate dielectric layer 148 has a same composition and thickness as the gate dielectric layer 126 of the sense transistor 108. The gate 150 has a same composition as the floating gate 130 of the sense transistor 108. N-type access source/drain regions 152 are disposed in the isolated p-type well 118, extending partway under the gate 150. The access source/drain regions 152 do not extend as far under the gate 150 as the sense source/drain regions 138 extend under the floating gate 130. For example, the access source/drain regions 152 may extend less than 25 nanometers extend under the floating gate 130. The access source/drain regions 152 include deep source/drain portions 154 disposed outward of the gate 150. The deep source/drain portions 154 of the access transistor 110 have similar doping distributions to the deep source/drain portions 142 of the sense transistor 108. The access source/drain region 152 adjacent to the sense transistor 108 is contiguous with the sense source/drain region 138 adjacent to the access transistor 110 as indicated in FIG. 1 by the phantom line. Offset spacers 156 are disposed on sidewalls of the gate 150 and source/drain sidewall spacers 158 are disposed on the offset spacers 156.

N-type contact regions 160 may be disposed at the top surface 116 of the substrate 102 in the n-type well 122 surrounding the sense transistor 108 and the access transistor 110. The contact regions 160 may have similar doping distributions to the deep source/drain portions 142 of the sense transistor 108 and the deep source/drain portions 154 of the access transistor 110.

The logic NMOS transistor 112 includes a gate dielectric layer 162 disposed on the top surface 116 of the substrate 102 in the p-type well 124, and a gate 164 on the gate dielectric layer 162. The gate dielectric layer 162 has a same composition and thickness as the gate dielectric layer 126 of the sense transistor 108. The gate 164 has a same composition as the floating gate 130 of the sense transistor 108. N-type logic source/drain regions 166 are disposed in the p-type well 124, extending partway under the gate 164. The logic source/drain regions 166 do not extend as far under the gate 164 as the sense source/drain regions 138 extend under the floating gate 130. The logic source/drain regions 166 include deep source/drain portions 168 disposed outward of the gate 164. The deep source/drain portions 168 of the logic NMOS transistor 112 have similar doping distributions to the deep source/drain portions 142 of the sense transistor 108. Offset spacers 170 are disposed on sidewalls of the gate 164 and source/drain sidewall spacers 172 are disposed on the offset spacers 170.

Metal silicide 174 may be disposed at the top surface 116 of the substrate 102 on exposed silicon such as the deep source/drain portions 142 of the sense transistor 108, the deep source/drain portions 154 of the access transistor 110, the contact regions 160 in the n-type well 122 and the deep source/drain portions 168 of the logic NMOS transistor 112, and optionally on the gate 150 of the access transistor 110 and the gate 164 of the logic NMOS transistor 112. The metal silicide 174 is not disposed on the floating gate 130 of the sense transistor 108.

A pre-metal dielectric (PMD) layer 176 is disposed over the top surface 116 of the substrate 102 and over the metal silicide 174, the sense transistor 108, the access transistor 110 and the logic NMOS transistor 112. The PMD layer 176 may be a layer stack including a PMD liner of silicon nitride, a main layer of boron phosphorus silicate glass (BPSG) or silicon dioxide, and a cap layer of silicon nitride, silicon carbide, silicon carbide nitride or other hard dielectric material suitable for a stop layer for a tungsten chemical mechanical polish (CMP) process. Contacts 178 are disposed through the PMD layer 176 to provide electrical connections to the sense transistor 108, the access transistor 110 and the logic NMOS transistor 112 through the metal silicide 174. The contacts 178 include a contact liner 180 of titanium and titanium nitride contacting the PMD layer 176 and a contact fill metal 182 of tungsten on the contact liner 180. The contacts 178 may be formed by forming contact holes through the PMD layer 176, forming the contact liner 180 on sidewalls and bottoms of the contact holes, and forming a layer of the contact fill metal 182 on the contact liner 180, and subsequently removing the contact fill metal 182 and the contact liner 180 from a top surface of the PMD layer 176, for example by a metal CMP process or an etchback process.

An inter-metal dielectric (IMD) layer 184 is disposed on the PMD layer 176. The IMD layer 184 may include an etch stop layer of silicon carbide or silicon carbide nitride, a main layer of silicon dioxide or low-k dielectric material such as organic-silicate glass (OSG), and a cap layer of silicon nitride, silicon carbide, silicon carbide nitride or other hard dielectric material suitable for a stop layer for a copper CMP process. Metal interconnects 186 are disposed through the IMD layer 184 to provide electrical connections to the contacts 178. The metal interconnects 186 have a copper damascene structure, with trench liners 188 of tantalum nitride which abut the IMD layer 184 and make connection to the contacts 178, and copper fill metal 190 on the trench liners 188. The metal interconnects 186 may be formed by a copper damascene process including forming interconnect trenches through the IMD layer 184, forming the trench liners 188 on sidewalls and bottoms of the interconnect trenches, forming a copper seed layer as a first portion of the copper fill metal 190 on the trench liners 188 by sputtering, forming a fill copper layer by electroplating as a second portion of the copper fill metal 190 on the copper seed layer, and subsequently removing the copper fill metal 190 and the trench liners 188 by a copper CMP process.

The metal sense gate 136 of the sense transistor 108 may have a composition similar to the contact liners 180 of the contacts 178 or similar to the trench liners 188 of the metal interconnects 186, and may be formed in a same tool such as a reactive sputter tool or an atomic layer deposition tool. Forming the metal sense gate 136 in the same tool as the contact liners 180 or the trench liners 188 may advantageously reduce fabrication cost of the integrated circuit 100.

During operation of the integrated circuit 100, the sense transistor 108 may exhibit a desired level of reliability due to the sense channel length 140 under the floating gate 130 being less than 200 nanometers. The sense transistor 108 may have a program time significantly less than a millisecond, and a desired low program voltage, because the width 132 of the floating gate 130 is at least 400 nanometers, enabling sufficient width for the metal sense gate 136 after width reduction due to undercut by a wet etch process to define the metal sense gate 136. Data retention and endurance may also be significantly superior to a sense transistor in which the width of the floating gate is less than 300 nanometers.

Figure 2A:
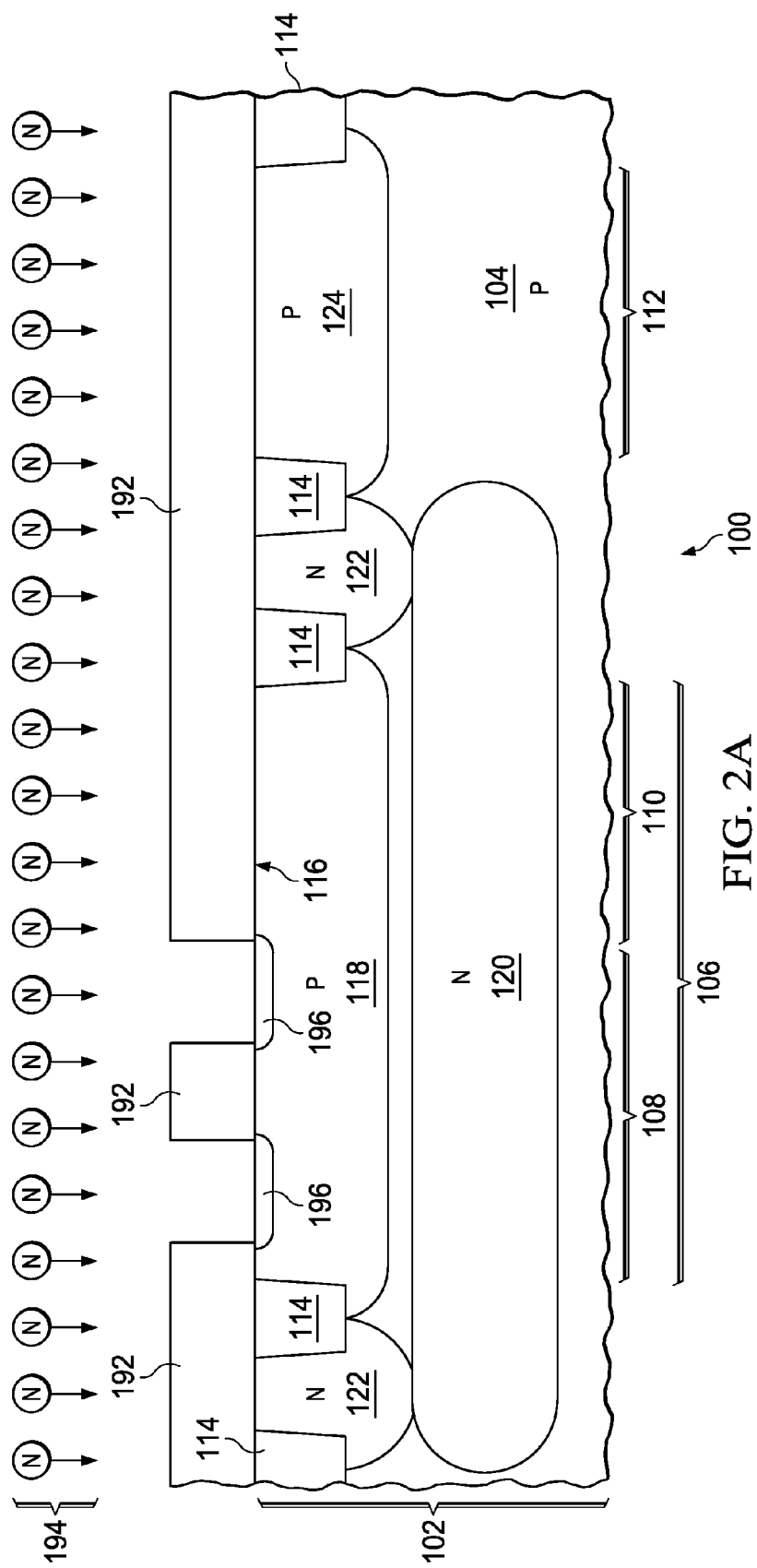
FIG. 2A through FIG. 2J are cross sections of the integrated circuit of FIG. 1, depicted in successive stages of an example fabrication sequence.

FIG. 2A through FIG. 2J are cross sections of the integrated circuit of FIG. 1, depicted in successive stages of an example fabrication sequence. Referring to FIG. 2A, the integrated circuit 100 is formed in and on the substrate 102. The substrate 102 may be, for example, a silicon wafer. The semiconductor material 104 may be a top portion of a bulk silicon wafer, or may be an epitaxial layer formed on a bulk silicon wafer. The field oxide 114 is formed, for example by a shallow trench isolation (STI) process. The deep n-type well 120 may be subsequently formed by implanting n-type dopants such as phosphorus into the substrate 102. For example, an implant using an implant mask including photoresist, at a dose of $2 \times 10^{12}$ cm$^{-2}$ to $5 \times 10^{12}$ cm$^{-2}$ at an energy of 1000 keV to 1500 keV, may produce a desired peak dopant distribution 1 micron to 1.5 microns below the top surface 116 of the substrate 102. The isolated p-type well 118 and the p-type well 124 may be formed by implanting p-type dopants such as boron into the substrate 102 using an implant mask including photoresist, at a dose of $5 \times 10^{12}$ cm$^{-2}$ to $1 \times 10^{13}$ cm$^{-2}$ at an energy of 250 keV to 350 keV, which produces a peak dopant distribution 0.6 microns to 0.9 microns below the top surface 116 of the substrate 102. Additional p-type dopants may be implanted concurrently to form punch-through reduction regions and threshold adjustment regions for the sense transistor 108, the access transistor 110 and the logic NMOS transistor 112. The n-type well 122 may be formed by implanting n-type dopants such as phosphorus into the substrate 102 using an implant mask including photoresist, at a dose of $5 \times 10^{12}$ cm$^{-2}$ to $2 \times 10^{13}$ cm$^{-2}$ at an energy of 400 keV to 600 keV, which produces a peak dopant distribution 0.4 microns to 0.8 microns below the top surface 116 of the substrate 102. The substrate 102 is subsequently annealed to activate the implanted dopants.

A sense source/drain mask 192 is formed over the substrate 102 which exposes the substrate 102 in areas for the sense source/drain regions 138 of FIG. 1. The sense source/drain mask 192 covers the substrate 102 between the areas for the sense source/drain regions 138. The sense source/drain mask 192 may optionally expose other areas for n-type source/drain areas or contact regions. N-type dopants 194 such as phosphorus and arsenic are implanted into the substrate 102 exposed by the sense source/drain mask 192, for example at a total dose of $5 \times 10^{13}$ cm$^{-2}$ to $3 \times 10^{14}$ cm$^{-2}$ at energies of 30 keV to 70 keV, to form sense source/drain implanted regions 196 in the areas for the sense source/drain regions 138. The sense source/drain mask 192 is subsequently removed, for example by an ash process followed by a wet clean process.

Figure 2B:
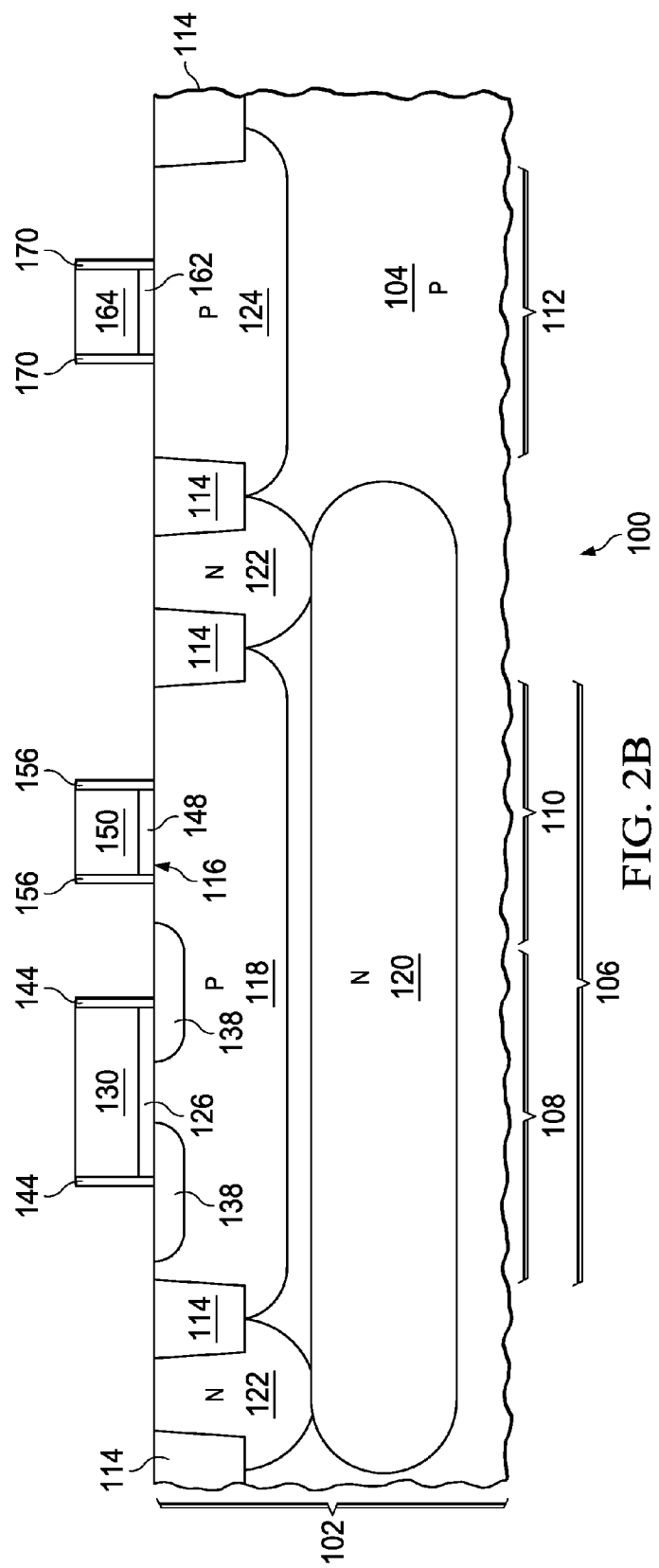

Referring to FIG. 2B, the gate dielectric layers 126, 148 and 162 of the sense transistor 108, the access transistor 110 and the logic NMOS transistor 112, respectively, are formed concurrently. The gate dielectric layers 126, 148 and 162 may be formed by thermal oxidation, and may optionally be nitridated, for example by exposure to a nitrogen-containing plasma. The gate dielectric layers 126, 148 and 162 may optionally include high-k dielectric material such as hafnium oxide or zirconium oxide. The implanted dopants in the sense source/drain implanted regions 196 of FIG. 2A may be at least partially activated during formation of the gate dielectric layers 126, 148 and 162 to form the sense source/drain regions 138.

The floating gate 130 of the sense transistor 108, the gate 150 of the access transistor 110 and the gate 164 of the logic NMOS transistor 112 are subsequently formed concurrently on the gate dielectric layers 126, 148 and 162, respectively. The floating gate 130, the gate 150 and the gate 164 may be formed, for example, by forming a layer of polysilicon 150 nanometers to 200 nanometers thick on a common layer of gate dielectric material, implanting the layer of polysilicon in areas for gates of n-channel transistors with n-type dopants such as phosphorus and possibly arsenic at a total dose of $1 \times 10^{15}$ cm$^{-2}$ to $6 \times 10^{15}$ cm$^{-2}$. A gate etch mask is subsequently formed over the layer of polysilicon to cover areas for gates of the NMOS transistors, including the floating gate 130, the gate 150 and the gate 164, and for gates of p-channel metal oxide semiconductor (PMOS) transistors. The layer of polysilicon is removed in areas exposed by the gate etch mask by a reactive ion etch (RIE) process, leaving polysilicon to form the floating gate 130, the gate 150 and the gate 164. The common layer of gate dielectric material outside of the gate dielectric layers 126, 148 and 162 may be reduced or removed by the RIE process.

The offset spacers 144, 156 and 170 are formed on the floating gate 130, the gate 150 and the gate 164, possibly concurrently. The offset spacers 144, 156 and 170 may include thermal oxide and optionally one or more layers of silicon dioxide and/or silicon nitride formed by plasma enhance chemical vapor deposition (PECVD).

Figure 2C:
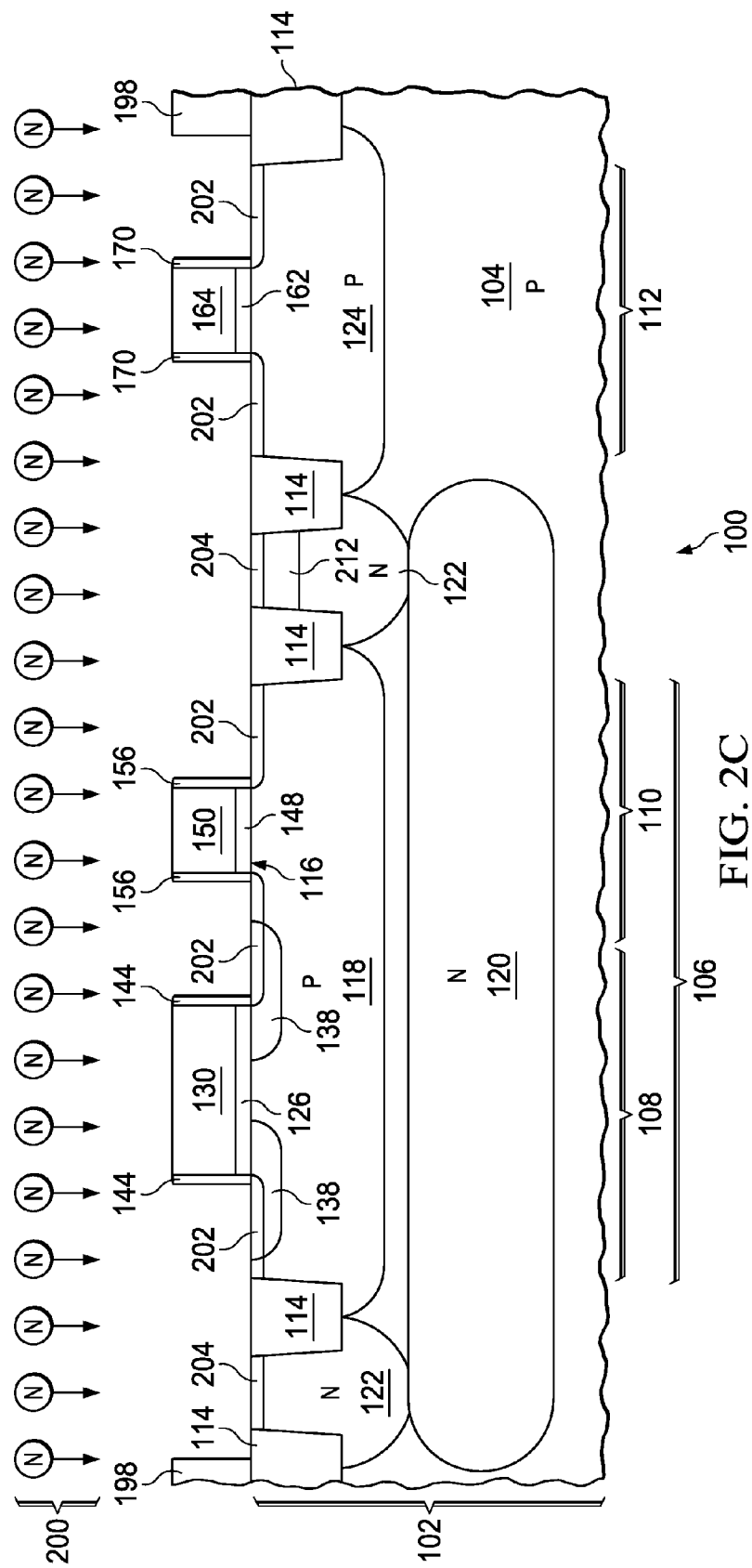

Referring to FIG. 2C, a lightly doped drain (LDD) mask 198 is formed over the substrate 102 which exposes areas adjacent to the floating gate 130, the gate 150 and the gate 164, and optionally in the n-type well 122. N-type dopants 200 such as phosphorus, and possibly arsenic, are implanted into the substrate 102 exposed by the LDD mask 198, for example at a total dose of $2 \times 10^{13}$ cm$^{-2}$ to $1 \times 10^{14}$ cm$^{-2}$ at an energy of 30 keV to 60 keV, to form drain extension implanted regions 202 adjacent to the floating gate 130, the gate 150 and the gate 164, and well tap implanted regions 204 in the n-type well 122. The floating gate 130, the gate 150 and the gate 164 block the n-type dopants 200. The LDD mask 198 is subsequently removed, for example as described in reference to FIG. 2A.

Figure 2D:
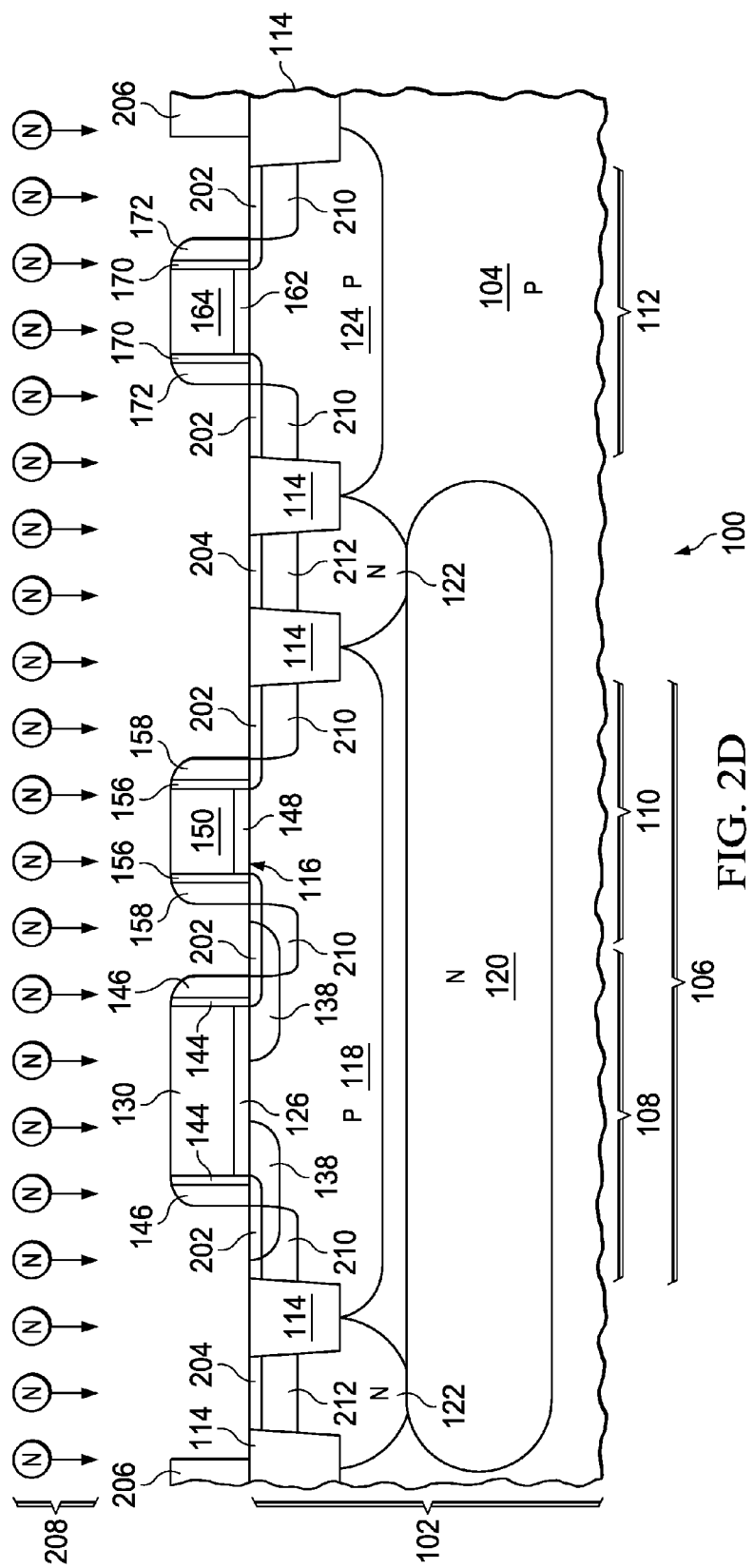

Referring to FIG. 2D, a deep source/drain mask 206 is formed over the substrate 102 which exposes the access transistor 110 and the logic NMOS transistor 112 and the n-type well 122, and may optionally expose the sense transistor 108 as depicted in FIG. 2D. N-type dopants 208 such as phosphorus and arsenic are implanted into the substrate 102 adjacent to the floating gate 130, the gate 150 and the gate 164, and in the n-type well 122, for example at a total dose of $1 \times 10^{15}$ cm$^{-2}$ to $5 \times 10^{15}$ cm$^{-2}$ at an energy of 40 keV to 70 keV, to form deep source/drain implanted regions 210 adjacent to the floating gate 130, the gate 150 and the gate 164, and form contact implanted regions 212 in the n-type well 122. The floating gate 130, the gate 150 and the gate 164 block the n-type dopants 208. The deep source/drain mask 206 is subsequently removed, for example as described in reference to FIG. 2A.

Figure 2E:
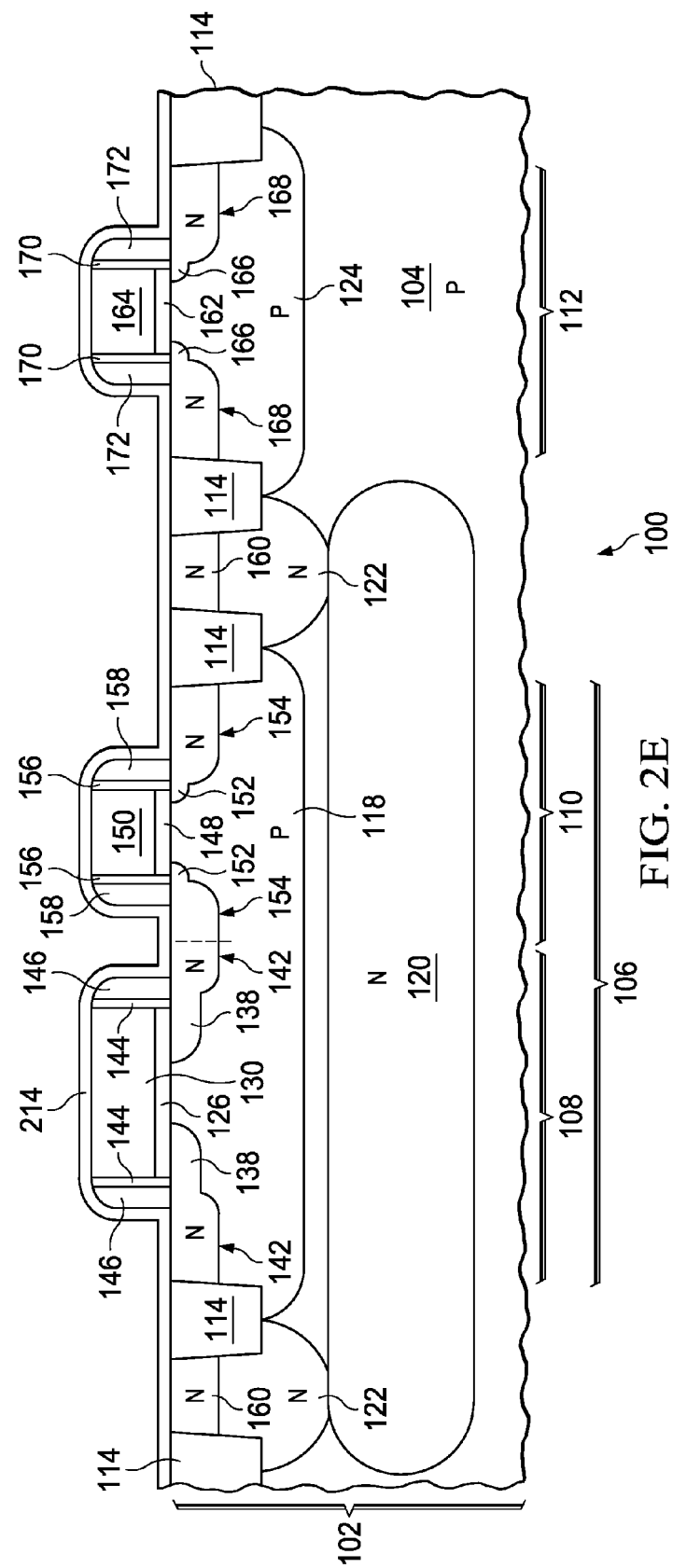

Referring to FIG. 2E, the substrate 102 is annealed to activate the implanted dopants in the drain extension implanted regions 202, the well tap implanted regions 204, the deep source/drain implanted regions 210 and the contact implanted regions 212 of FIG. 2D to form the deep source/drain portions 142 of the sense source/drain regions 138, form the deep source/drain portions 154 of the access source/drain regions 152, form the deep source/drain portions 168 of the logic source/drain regions 166, and form the contact regions 160 in the n-type well 122. The substrate 102 may be annealed, for example, by a spike anneal process in a rapid thermal processing (RTP) tool, or by a flash anneal process, or by a laser anneal process.

A layer of silicide block dielectric material 214 is formed over an existing top surface of the integrated circuit 100. The layer of silicide block dielectric material 214 may include one or more sub-layers of silicon dioxide and possibly silicon nitride, with a total thickness of, for example, 10 nanometers to 50 nanometers. Silicon dioxide in the layer of silicide block dielectric material 214 may be formed by a PECVD process.

Figure 2F:
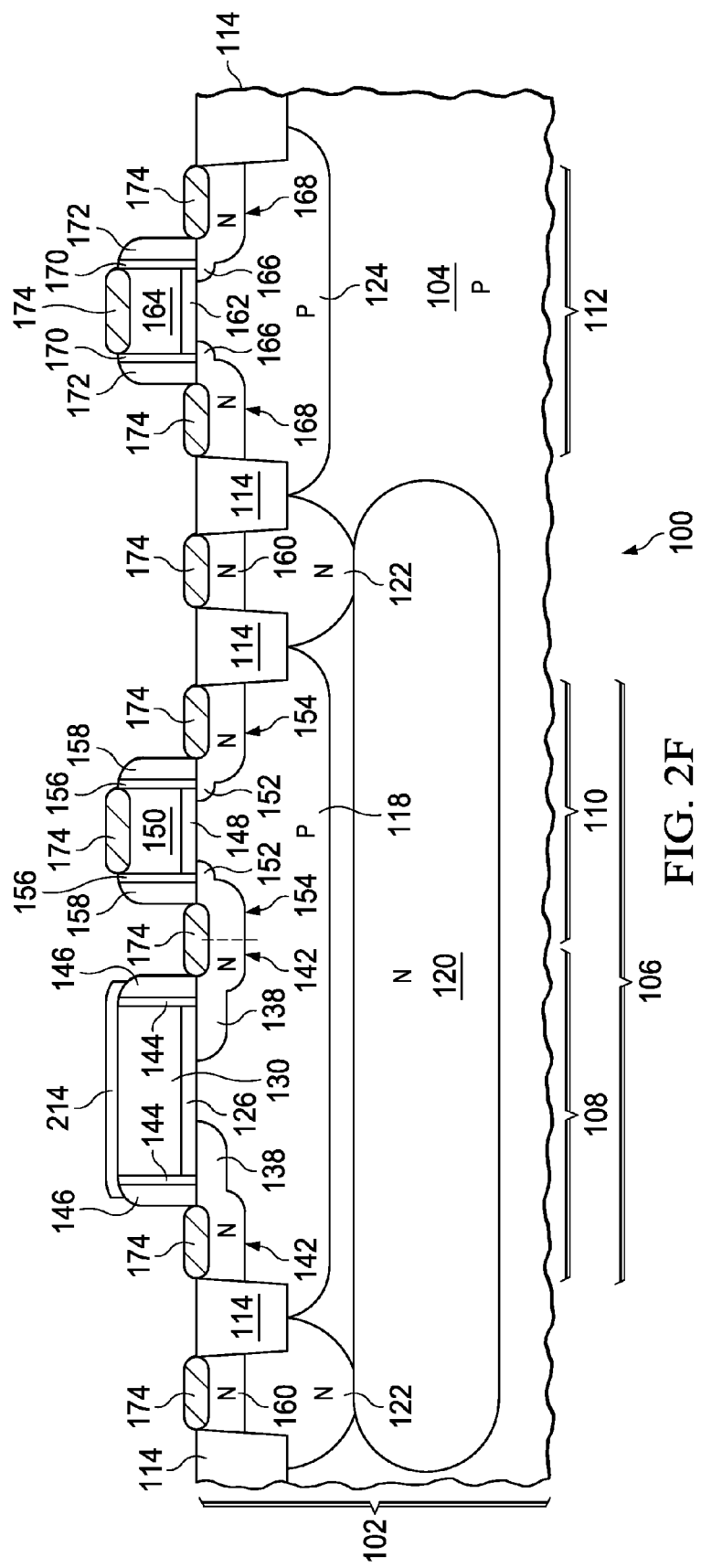

Referring to FIG. 2F, the layer of silicide block dielectric material 214 of FIG. 2E is patterned so as to cover the floating gate 130 of the sense transistor 108 to form a first portion of the top gate dielectric layer 134 of FIG. 1, and to expose the deep source/drain portions 142 of the sense source/drain regions 138, the deep source/drain portions 154 of the access source/drain regions 152, the deep source/drain portions 168 of the logic source/drain regions 166, and the contact regions 160 in the n-type well 122, the gate 150 of the access transistor 110 and the gate 164 of the logic NMOS transistor 112. The layer of silicide block dielectric material 214 may be patterned by forming an etch mask by a photolithographic process and removing the layer of silicide block dielectric material 214 where exposed by the etch mask by a wet etch process or an RIE process.

The metal silicide 174 is formed on silicon exposed by the patterned layer of silicide block dielectric material 214. The metal silicide 174 may be formed, for example, by forming a layer of refractory metal, such as titanium, cobalt or nickel, on the exposed silicon, and heating the substrate 102 to react the exposed silicon with the refractory metal to form the metal silicide 174. Unreacted metal is subsequently removed by a wet etch process, for example an aqueous mixture of sulfuric acid and hydrogen peroxide, or an aqueous mixture of ammonium hydroxide and hydrogen peroxide.

Figure 2G:
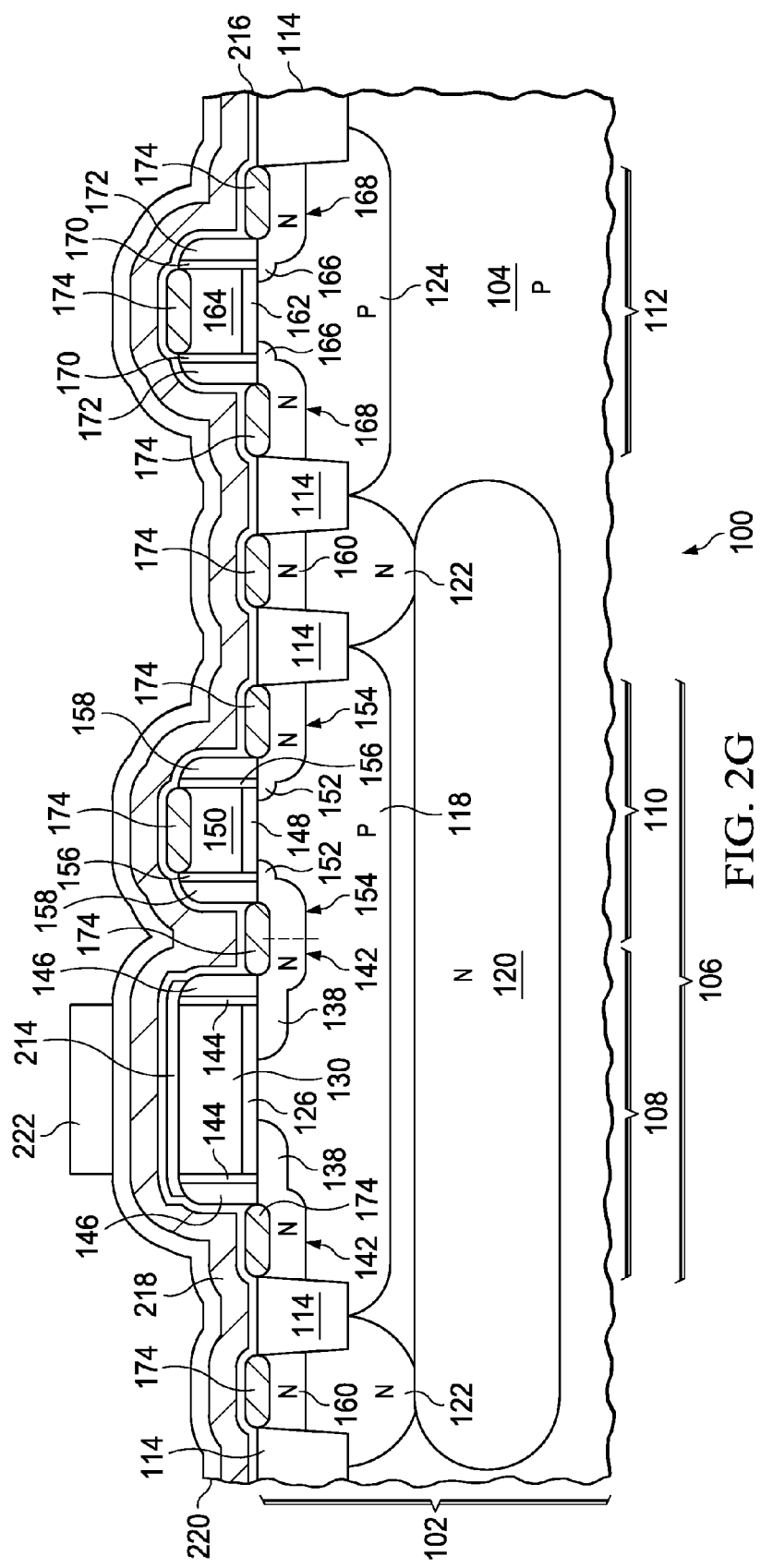

Referring to FIG. 2G, a dielectric barrier layer 216 is formed over the metal silicide 174 and the partially formed top gate dielectric layer 134 of FIG. 1. The dielectric barrier layer 216 may be a layer stack including a first sub-layer of silicon dioxide 5 nanometers to 20 nanometers thick, a sub-layer of silicon nitride 5 nanometers to 20 nanometers thick on the first sub-layer of silicon dioxide, and a second sub-layer of silicon dioxide 5 nanometers to 20 nanometers thick on the sub-layer of silicon nitride. Silicon dioxide in the dielectric barrier layer 216 may be formed by PECVD using tetraethoxysilane (TEOS). Silicon nitride in the dielectric barrier layer 216 may be formed by PECVD using bis-tertiary butyl amino silane (BTBAS). Other layer structures or compositions for the dielectric barrier layer 216 are within the scope of the instant example. The total thickness of the dielectric barrier layer 216 may be, for example, 20 nanometers to 40 nanometers.

A layer of gate metal 218 is formed on the dielectric barrier layer 216. The layer of gate metal 218 may be, for example, 40 nanometers to 80 nanometers thick and may include, for example, tantalum nitride, tantalum, titanium nitride or titanium. Titanium and tantalum in the layer of gate metal 218 may be formed by sputtering. Tantalum nitride and titanium nitride in the layer of gate metal 218 may be formed by reactive sputtering in a nitrogen ambient or atomic layer deposition.

A hard mask layer 220 is formed on the layer of gate metal 218. The hard mask layer 220 may include silicon nitride formed by PECVD and may be 25 nanometers to 50 nanometers thick.

A gate mask 222 is formed over the hard mask layer 220 which covers an area for the metal sense gate 136 of FIG. 1. The gate mask 222 exposes the hard mask layer 220 elsewhere, including over the deep source/drain portions 142 of the sense transistor 108 and over the access transistor 110 and the logic NMOS transistor 112. The gate mask 222 may be formed of photoresist by a photolithographic process. A width of the gate mask 222 is selected to provide a desired width of the metal sense gate 136 allowing for undercut during a wet etch process of the layer of gate metal 218. Forming the floating gate 130 to have a width of at least 400 nanometers, as discussed in reference to FIG. 1, advantageously enables the gate mask 222 to be formed with sufficient width to provide the desired width of the metal sense gate 136.

Figure 2H:
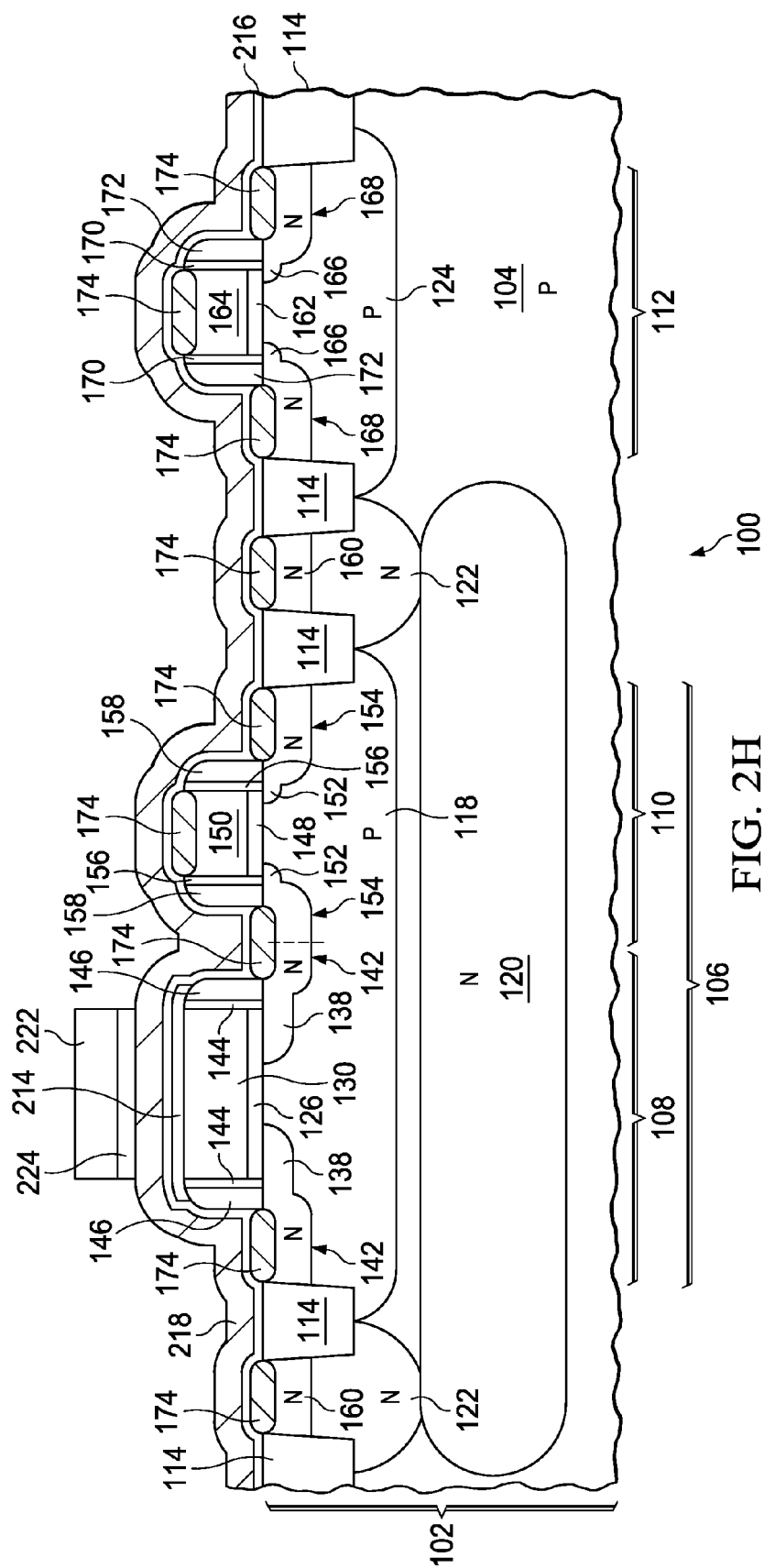

Referring to FIG. 2H, the hard mask layer 220 of FIG. 2G is removed where exposed by the gate mask 222 by an RIE process, leaving the hard mask layer 220 under the gate mask 222 to form a hard mask 224. The gate mask 222 may be removed or left in place during a subsequent metal gate etch process.

Figure 2I:
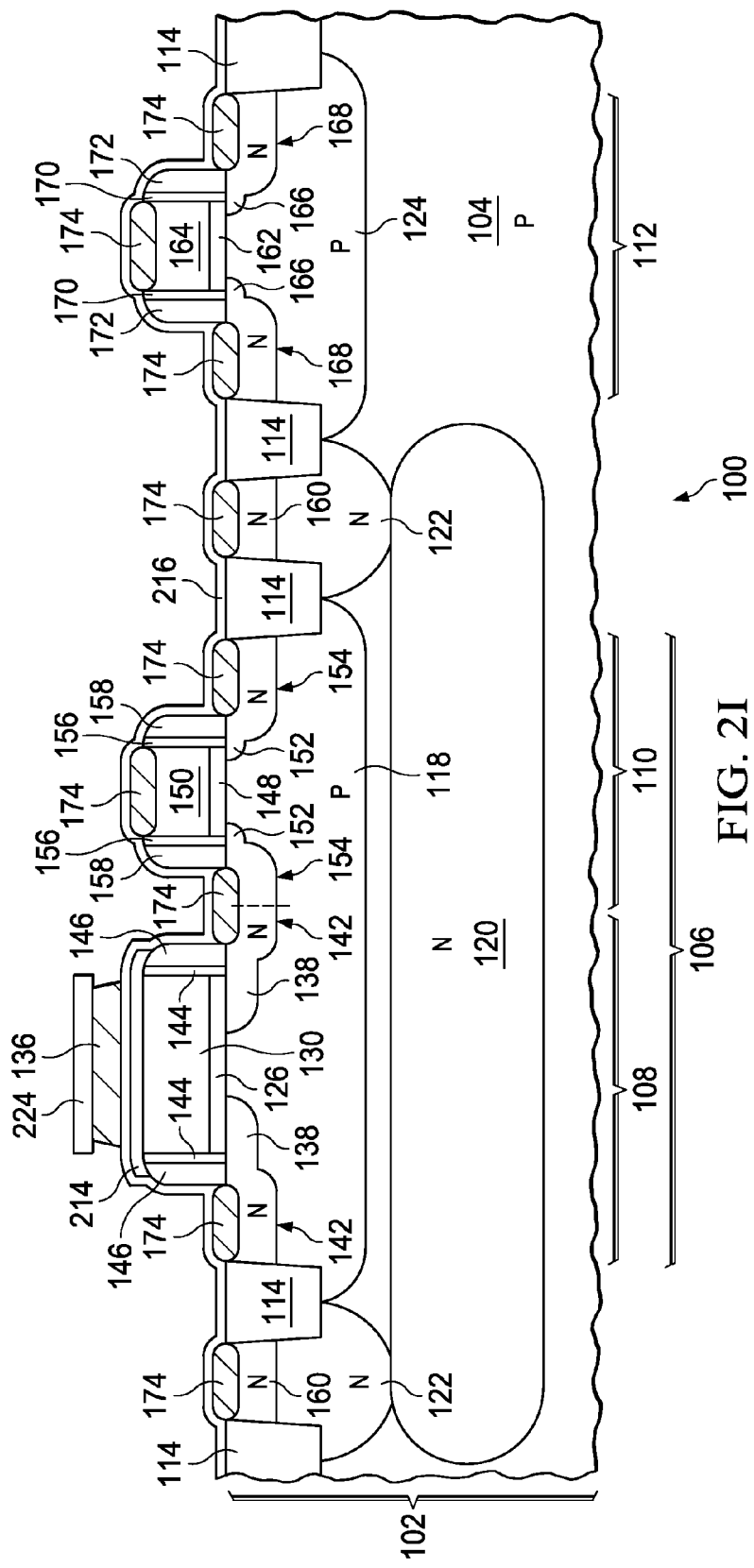

Referring to FIG. 2I, the layer of gate metal 218 of FIG. 2H is removed where exposed by the hard mask 224, leaving the layer of gate metal 218 under the hard mask 224 to provide the metal sense gate 136. The layer of gate metal 218 may be removed by a wet etch process with an aqueous mixture of concentrated ammonium hydroxide and hydrogen peroxide. Other methods to etch the layer of gate metal 218 are within the scope of the instant example. The gate mask 222 of FIG. 2H may be eroded by the wet etch process, or may be completely removed, as depicted in FIG. 2I. The wet etch process may undercut the layer of gate metal 218. The dielectric barrier layer 216 protects the metal silicide 174 during the removal of the layer of gate metal 218. The hard mask 224 may be removed while the dielectric barrier layer 216 is in place, or may be removed during subsequent fabrication steps.

Figure 2J:
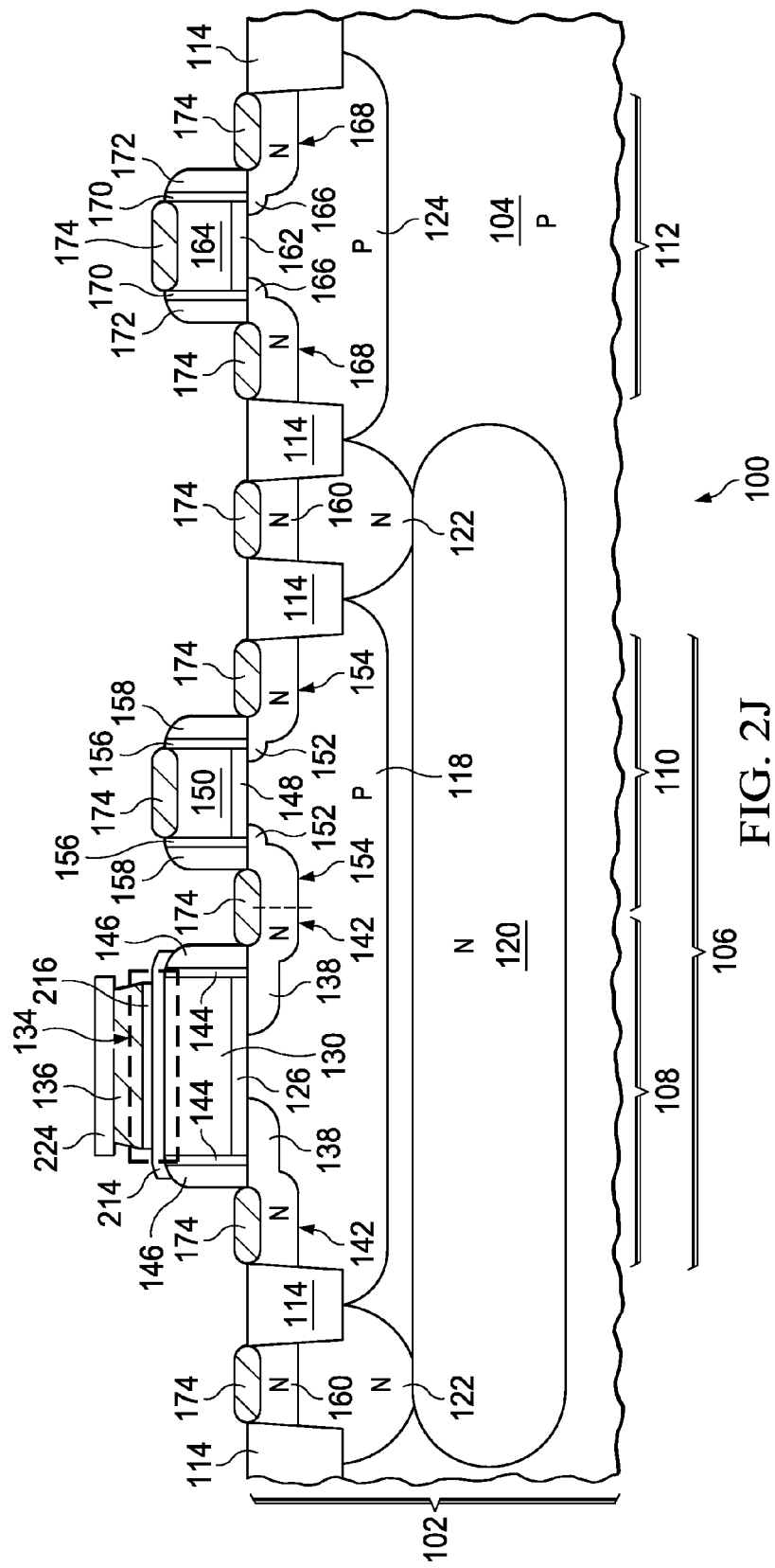

Referring to FIG. 2J, the dielectric barrier layer 216 of FIG. 2I is removed where exposed by the metal sense gate 136. The dielectric barrier layer 216 may be removed by a plasma etch process which is selective to the metal silicide 174. The dielectric barrier layer 216 remains under the metal sense gate 136 to provide a second portion of the top gate dielectric layer 134. A combination of the patterned layer of silicide block dielectric material 214 and the dielectric barrier layer 216 provide the top gate dielectric layer 134.

The hard mask 224, if remaining, is removed. Fabrication of the integrated circuit 100 continues with formation of the PMD layer 176 of FIG. 1. The flash memory 106 is thus formed with one extra photolithographic operation, the gate mask 222 of FIG. 2G, advantageously reducing a cost of the integrated circuit 100 compared to an equivalent integrated circuit with a conventional embedded flash memory requiring three extra photolithographic operations.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit including a flash memory, comprising the steps:
   providing a substrate comprising a semiconductor material;
   forming a sense source/drain mask over a top surface of the substrate which exposes the substrate in areas for first and second sense source/drain regions of a sense transistor of the flash memory and covers the substrate between the areas for the first and second sense source/drain regions;
   implanting dopants into the substrate in the areas exposed by the sense source/drain mask;
   removing the sense source/drain mask;
   forming a gate dielectric layer of the sense transistor on the top surface of the substrate after removing the sense source/drain mask;
   forming a floating gate of polysilicon at least 400 nanometers wide on the gate dielectric layer;
   activating the implanted dopants to form first and second sense source/drain regions which extend partway under the floating gate, separated by less than 200 nanometers;
   forming a top gate dielectric layer over the floating gate;
   forming a layer of gate metal over the top gate dielectric layer;
   forming a mask over the layer of gate metal, so that the mask covers an area for a metal sense gate over the floating gate; and
   removing the layer of gate metal where exposed by the mask to form the metal sense gate on the top gate dielectric layer.

2. The method of claim 1, wherein the metal sense gate includes metal selected from the group consisting of tantalum, tantalum nitride, titanium, and titanium nitride.

3. The method of claim 1, comprising implanting dopants into the substrate adjacent to the floating gate using the floating gate as a mask to form deep source/drain portions of the first and second sense source/drain regions, the deep source/drain portions being disposed outward of the floating gate.

4. The method of claim 3, comprising forming metal silicide on the deep source/drain portions of the first and second sense source/drain regions.

5. The method of claim 4, comprising the steps:
   forming a layer of silicide block dielectric material over the floating gate and the deep source/drain portions of the first and second sense source/drain regions;
   patterning the layer of silicide block dielectric material to leave the layer of silicide block material over the floating gate and removing the layer of silicide block dielectric material over the deep source/drain portions of the first and second sense source/drain regions, before forming the metal silicide;
   forming a dielectric barrier layer over the layer of silicide block dielectric material on the floating gate and over the metal silicide, before forming the layer of gate metal; and
   removing the dielectric barrier layer from over the metal silicide after removing the layer of gate metal to form the metal sense gate, wherein a combination of the layer of silicide block dielectric material and the dielectric barrier layer provide the top gate dielectric layer.

6. The method of claim 5, wherein the layer of silicide block dielectric material comprises silicon dioxide and the dielectric barrier layer is a layer stack comprising a sub-layer of silicon dioxide and a sub-layer of silicon nitride.

7. The method of claim 1, comprising the steps:
   forming interconnect trenches in a dielectric layer;
   forming trench liners on sidewalls and bottoms of the interconnect trenches; and
   forming copper on the trench liners, wherein the trench liners have a same composition as the metal sense gate.

8. The method of claim 1, wherein removing the layer of gate metal where exposed by the mask to form the metal sense gate is performed by a wet etch process.

9. The method of claim 8, wherein the wet etch process includes an aqueous solution of concentrated ammonium hydroxide and hydrogen peroxide.

10. The method of claim 1, comprising forming a gate dielectric layer of a logic NMOS transistor concurrently with the gate dielectric layer of the sense transistor.

11. A method of forming an integrated circuit including a flash memory, comprising the steps:
    providing a substrate comprising a semiconductor material;
    forming a sense source/drain mask over a top surface of the substrate which exposes the substrate in areas for sense source drain regions of a sense transistor of the flash memory and covers the substrate between the areas for the sense source drain regions;
    implanting dopants into the substrate in the areas exposed by the sense source/drain mask;
    removing the sense source/drain mask;
    forming a gate dielectric layer of the sense transistor on the top surface of the substrate after removing the sense source/drain mask;
    forming a floating gate of the sense transistor of polysilicon at least 400 nanometers wide on the gate dielectric layer;
    activating the implanted dopants to form sense source/drain regions of the sense transistor which extend partway under the floating gate, separated by less than 200 nanometers;
    implanting dopants into the substrate adjacent to the floating gate using the floating gate as a mask to form deep source/drain portions of the sense source/drain regions, the deep source/drain portions being disposed outward of the floating gate;
    forming a layer of silicide block dielectric material over the floating gate and the deep source/drain portions of the sense source/drain regions;
    patterning the layer of silicide block dielectric material to leave the layer of silicide block material over the floating gate and removing the layer of silicide block dielectric material over the deep source/drain portions of the sense source/drain regions;
    forming a layer of refractory metal on the deep source/drain portions of the sense source/drain regions and heating the substrate to form metal silicide on the deep source/drain portions, wherein the patterned layer of silicide block dielectric material on the floating gate prevents metal silicide from forming on the floating gate, and subsequently removing unreacted metal;
    forming a dielectric barrier layer over the patterned layer of silicide block dielectric material on the floating gate and over the metal silicide;
    forming a layer of gate metal over the dielectric barrier layer;
    forming a hard mask layer over the layer of gate metal;
    removing the hard make layer over the metal silicide to form a hard mask over the floating gate;

removing the layer of gate metal where exposed by the hard mask to form a metal sense gate of the sense transistor over the floating gate; and removing the dielectric barrier layer from over the metal silicide after forming the metal sense gate, wherein a combination of the layer of silicide block dielectric material and the dielectric barrier layer provide a top gate dielectric layer of the sense transistor.

* * * * *